(12) United States Patent
Kauffmann

(10) Patent No.: US 11,481,034 B2
(45) Date of Patent: Oct. 25, 2022

(54) OBJECT TRACKING USING MAGNETIC FIELD SENSING AND BACKSCATTER TRANSMISSIONS

(71) Applicant: Google LLC, Mountain View, CA (US)

(72) Inventor: Alejandro Kauffmann, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 16/768,761

(22) PCT Filed: Oct. 24, 2019

(86) PCT No.: PCT/US2019/057905
§ 371 (c)(1),
(2) Date: Jun. 1, 2020

(87) PCT Pub. No.: WO2020/086876
PCT Pub. Date: Apr. 30, 2020

(65) Prior Publication Data
US 2021/0240273 A1 Aug. 5, 2021

Related U.S. Application Data

(60) Provisional application No. 62/750,189, filed on Oct. 24, 2018.

(51) Int. Cl.
*G06F 3/01* (2006.01)
*G01R 33/00* (2006.01)
(Continued)

(52) U.S. Cl.
CPC ......... *G06F 3/017* (2013.01); *G01R 33/0094* (2013.01); *G06F 3/038* (2013.01); *G06F 3/03545* (2013.01)

(58) Field of Classification Search
None
See application file for complete search history.

(56) References Cited

U.S. PATENT DOCUMENTS 8,907,913 B2 12/2014 Paulsen
8,933,913 B2 1/2015 Nowatzyk et al.
(Continued)

FOREIGN PATENT DOCUMENTS

WO WO2013/023079 2/2013

OTHER PUBLICATIONS

International Search Report and Written Opinion for Application No. PCT/US2019/057905, dated Jan. 24, 2020, 13 pages.

*Primary Examiner* — Yi Wang
(74) *Attorney, Agent, or Firm* — Dority & Manning, P.A.

(57) ABSTRACT

A low-power object tracking system is disclosed that includes an object tracking device that senses one or more magnetic field(s) to determine a position of the object tracking device. The object tracking device includes a magnetic field sensor including one or more receiving coils and position tracking circuitry in communication with the magnetic field sensor. The position tracking circuitry is configured to determine at least one field strength associated with at least one stationary magnetic field sensed at the one or more receiving coils, and to determine position information associated with the housing based at least in part on the at least one field strength. The object tracking device includes a communication interface configured to transmit the position information to at least one remote computing device.

16 Claims, 10 Drawing Sheets

(51) Int. Cl.
G06F 3/0354 (2013.01)
G06F 3/038 (2013.01)

(56) References Cited

U.S. PATENT DOCUMENTS

| | | |
|---|---|---|
| 9,377,878 B2 | 6/2016 | Peralta et al. |
| 10,635,172 B1* | 4/2020 | Keller .................... G01B 7/004 |
| 2003/0227470 A1* | 12/2003 | Genc ....................... G06F 3/017 |
| | | 345/633 |
| 2013/0002614 A1 | 1/2013 | Nowatzyk et al. |

* cited by examiner

OBJECT TRACKING USING MAGNETIC FIELD SENSING AND BACKSCATTER TRANSMISSIONS

RELATED APPLICATION

This application is based upon and claims the right of priority under 35 U.S.C. § 371 to International Application No. PCT/US2019/057905, filed Oct. 24, 2019, which claims the right of priority to U.S. Provisional Application No. 62/750,189, filed on Oct. 24, 2018. The above applications are hereby incorporated by reference herein in their entirety for all purposes.

FIELD

The present disclosure relates generally to object tracking.

BACKGROUND

Object motion tracking may be used to track the location of objects using electronic components. For example, object motion tracking may be used to track a stylus that is moved by a user to provide input to a computing device. The computing device can capture the user's handwriting, perform handwriting recognition, and/or perform other functions based on the input received by tracking the stylus.

Common technologies for wireless tracking of objects rely on processor-intensive computing techniques. As such, these technologies require relatively large amounts of power. Such architectures may be detrimental to a true concept of an internet of things. For example, presently the things that make up the so-called Internet of Things (IoT) are largely just computers that are shaped like familiar objects. As such, these devices tend to have similar power, connectivity, and management requirements. As a result of the device requirements, these things are less like things, and more like thing-shaped devices (e.g., computers). The nature of these devices may therefore affect a user's relationship with the device. A user may find that a device demands frequent attention in the form of charging, applications, upgrades, troubleshooting, user accounts, etc. As such, the device is less likely to be treated as a commodity-type thing, and more like a personal object to which the user should be attuned, so as to properly use, and not lose or damage the device. For example, a user may not treat a stylus that provides input to a computer in the same manner the user may treat a pen or pencil.

Accordingly, there remains a need for more efficient and cost-effective technologies for object motion tracking.

SUMMARY

Aspects and advantages of embodiments of the present disclosure will be set forth in part in the following description, or may be learned from the description, or may be learned through practice of the embodiments.

One example aspect of the present disclosure is directed to an object tracking device that includes a magnetic field sensor comprising one or more receiving coils and position tracking circuitry in communication with the magnetic field sensor. The position tracking circuitry is configured to determine at least one field strength associated with at least one stationary magnetic field sensed at the one or more receiving coils and to determine position information associated with the object tracking device based at least in part on the at least one field strength. The object tracking device includes a communication interface configured to transmit the position information to at least one remote computing device.

Another example aspect of the present disclosure is directed to an object tracking system that includes a magnetic field transmitter comprising one or more transmitting coils configured to generate at least one stationary magnetic field, an object tracking device, and a computing device configured to receive position information from the communication interface and to initiate at least one action based on the position information. The object tracking device includes a magnetic field sensor in communication with the magnetic field sensor comprising one or more receiving coils configured to sense the at least one stationary magnetic field, position tracking circuitry configured to determine at least one field strength associated with the at least one stationary magnetic field and to determine position information associated with the object tracking device based on the at least one field strength, and a communication interface configured to transmit the position information.

Yet another example aspect of the present disclosure is directed to an object tracking system that includes a magnetic field transmitter comprising one or more transmitting coils configured to generate at least one stationary magnetic field, and a plurality of object tracking devices. Each object tracking device includes a magnetic field sensor configured to sense the at least one stationary magnetic field and a communication interface configured to transmit position information based on a sensed strength of the at least one stationary magnetic field. The object tracking system includes one or more computing devices configured to receive the position information from the communication interface and to initiate at least one action based on the position information.

Other example aspects of the present disclosure are directed to systems, apparatus, computer program products (such as tangible, non-transitory computer-readable media but also such as software which is downloadable over a communications network without necessarily being stored in non-transitory form), user interfaces, memory devices, and electronic devices for object tracking These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
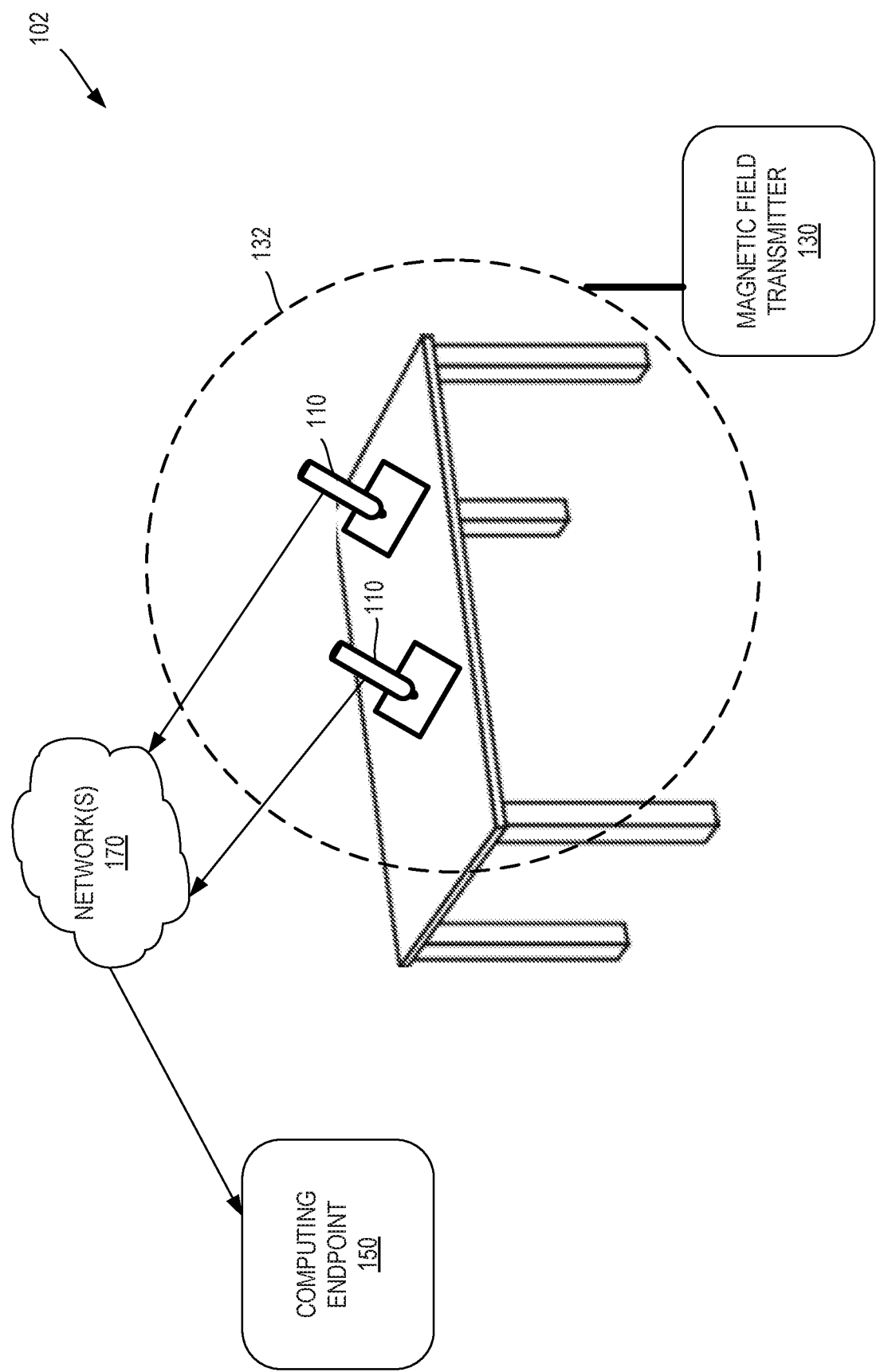
FIG. 1 depicts a block diagram of an example computing environment including an object tracking system with a magnetic field receiver in accordance with example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Generally, the present disclosure is directed to a low-power object tracking system including an object tracking device that senses one or more magnetic field(s) and determines a position of the object tracking device based on the sensed magnetic field. Movement, for example, on any surface can be tracked accurately enough to capture ordinary writing using a stylus remotely located from a magnetic field transmitter. By way of example, movement of an object on the order of millimeters can be captured at distances of a meter or more from a magnetic field transmitter. The object tracking device can include a magnetic field sensor such as a receiver that is configured to sense one or more magnetic fields in an environment external to the object tracking device. The magnetic field sensor can include one or more receiver coils configured to sense the one or more magnetic fields. The object tracking device can include position tracking circuitry that determines a strength of the one or more magnetic fields and determines position information for the object tracking device based on the strength of the sensed magnetic field(s). The position information can indicate a location and/or an orientation for the object tracking device. By configuring the object tracking device as a receiver that senses one or more externally generated magnetic fields, power requirements can be reduced when compared with object tracking devices that rely on a field transmitter in the object tracking device. Instead, the disclosed technology can utilize an externally positioned field transmitter so that the object tracking device includes a receiver rather than a magnetic field transmitter. In this manner, the device may reduce power consumption and/or hardware requirements. The object tracking device can transmit the position information to one or more remote computing endpoints. By way of example, a remote computing endpoint can receive the position information and perform handwriting recognition on the position information to generate handwriting data.

According to example implementations, an object tracking system may include an object tracking device and a magnetic field transmitter located remotely from the object tracking device. The magnetic field transmitter can include one or more transmitter coils that generate one or more stationary magnetic fields. The stationary magnetic field(s) can have a known geometry. By way of example, a magnetic field transmitter may include three transmitter coils configured to generate three orthogonal magnetic fields. In some examples, each magnetic field has a frequency of about 100 KHz. Other frequencies including those in lower frequency ranges (e.g., such as in a range of about 40 KHz to 70 kHz) or higher frequency ranges (e.g. GHz) can be used. A magnetic field in some examples has a radius greater than 0.5 m. For instance, the magnetic field can have a radius greater than 1.0 m, such as greater than 2.0 m, such as greater than about 3.0 m, such as greater than about 4.0 m, such as greater than about 5.0 m.

The object tracking device can localize an internal sensor with respect to the one or more magnetic field(s) which have a known geometry. For example, the size and/or shape of the magnetic field(s) may be known. The sensor can include a receiver having one or more receiver coils configured to sense the one or more magnetic field(s). In some examples, the receiver includes three receiver coils each associated with an individual one of the three orthogonal magnetic fields. Each receiver coil can sense the corresponding magnetic field using magnetic induction. According to some implementations, the object tracking device can sense the one or more magnetic fields without having a line of sight between the device and the magnetic field source. Using three receiver coils and three corresponding magnetic fields, example systems can implement an inexpensive six degrees of freedom (DoF) tracking system.

By positioning the magnetic field receiver within the object tracking device, the disclosed object tracking system can be inexpensive and easily miniaturizable. For instance, the receiver coils may have smaller power requirements compared with the power requirements of transmitter coils configured to generate a magnetic field. Accordingly, object tracking devices as described can be embedded into everyday objects. This can be contrasted with traditional techniques that provide a transmitter in the object tracking device and utilize a receiving sensor at a remote device. Such an architecture is reversed in accordance with example embodiments to provide an object tracking device, such as a stylus, with reduced hardware requirements and lower associated costs.

An object tracking device can include one or more communication interfaces configured to transmit position information determined by the position tracking circuitry to one or more computing endpoints. A computing endpoint can be a remote computing device, such as a remote server or client device. The object tracking device can transmit the position information to the one or more computing endpoints over one or more networks. For example, an object tracking device can transmit position information to a remote user computing device or a remote server over one or more local Wi-Fi networks. Bluetooth networks, and/or one or more near field communication networks. In such examples, the object tracking device can include a radio frequency transmitter. In other examples, the object tracking device can include backscatter circuitry that can encode position information using one or more remotely generated radio frequency signals. In such examples, the object tracking device may not include a radio frequency transmitter and can generate backscatter signals without requiring an onboard power source to power transmission of the position information.

In accordance with example embodiments, a magnetic field transmitter may include a power amplifier, signal generator, and transmitter including one or more transmitter coils. The amplifier, signal generator, transmitter can be disposed at least partially within a housing. The magnetic field transmitter can be coupled to an external power source. In some examples, a magnetic field transmitter may operate from a standard power source such as 60 Hz and 120 V AC to produce one or more magnetic fields using one or more transmitter coils. The signal generator can generate one or more signals such as an alternating current having a specified frequency to induce a magnetic field when the alternating current is passed through a transmission coil. In some examples, the transmitter may include three transmitter coils. The three transmitter coils can be disposed orthogonally to one another to generate three orthogonal magnetic fields in example embodiments. In some examples, a different frequency can be used for the alternating current of each transmitter coil. In other examples, the same frequency can be used for each transmitter coil. In yet another example, the frequency for or an individual one of the transmitter coils may be varied such as by frequency hopping to generate unique frequency magnetic fields for tracking individual ones of a plurality of object tracking devices.

The housing of a magnetic field transmitter can be configured in various manners according to the requirements of a particular implementation. In some examples, a magnetic field transmitter can be a stand-alone device. In other examples, the magnetic field transmitter can be incorporated within other electric components such as a lightbulb, a light switch, a smoke alarm, or a computing device such as laptop, smartphone, server, or smartphone device, etc. In any case, the magnetic field transmitter can be easily positioned within a room or other area to provide one or more magnetic fields for use by one or more object tracking devices within the room or area. According to some aspects, a magnetic field transmitter can be provided in a common housing with a computing endpoint to provide a magnetic transmission hub. In some examples, the magnetic field transmitter can be provided in a common housing with a radio frequency transmitter used to generate signals used by backscatter circuitry in the object tracking devices. In some instances, the magnetic field transmitter, computing endpoint, and radio frequency transmitter can all be disposed within a common housing.

In accordance with example embodiments, a plurality of object tracking devices can be used with a single magnetic transmitter within an object tracking system. For instance, a plurality of object tracking devices may simultaneously sense one or more of magnetic fields generated by the magnetic transmitter and determine position information based on sensing magnetic field(s). Each object tracking device may transmit position information to one or more computing endpoints. Each object tracking device can transmit position information to the same computing endpoint in some examples. In other examples, each object tracking device can transmit position information to a different computing endpoint. For instance, a user may provide an indication or other selection of a computing endpoint to which the object tracking device should transmit the position information.

In accordance with some embodiments, a magnetic field transmitter may utilize multiple frequencies, such as by frequency hopping as part of determining position information for multiple object tracking devices. For example, the magnetic field transmitter may generate one or more magnetic fields by frequency hopping through a plurality of frequencies. Each frequency may be associated with a particular object tracking device so that position information can be determined for an individual device. In other examples, multiple object tracking devices can utilize the same frequency to determine position information. For example, each object tracking device can transmit position information to a computing endpoint along with an identifier of the tracking device associated with the position information. Other techniques may be used.

An object tracking device in accordance with example embodiments can include a plurality of components arranged within an exterior housing. The exterior housing may include numerous form factors according to the requirements of various implementations. By way of example, the exterior housing may be formed in the shape of a pencil, stylus, or other user input mechanism. In other examples, the exterior housing may not be formed as a user input mechanism, such as where the object tracking mechanism is used for location tracking of commodities. The object tracking device can include a sensor comprising one or more receiver coils and associated circuitry to determine a magnetic field strength sensed by the one or more receiver coils. For example, the sensor may include a set of three orthogonally oriented receiver coils, each configured to sense a different one of a set of three orthogonal magnetic fields. The object tracking device can include signal processing circuitry configured to process the signal from each of the receiver coils. In some examples, the signal processing circuitry can determine a signal strength or field strength associated with each of the receiver coils. The field strength can indicate the strength of the magnetic field sensed by the respective receiver coil. Position tracking circuitry can determine the position of the object tracking device based on the field strength associated with each of the receiver coils. For example, the object tracking device may determine object movement and position information by determining the relative strength of each of the three orthogonal magnetic fields. Based on the relative strength of each of the magnetic fields, the position tracking circuitry can determine a position of the object tracking device in space. In some examples, the position information determined by the position tracking circuitry is three-dimensional position information, for example, indicating a three-dimensional coordinate for each of the positions of the object tracking device. In other examples, the position information may be two-dimensional position information such as a two-dimensional coordinate. The object tracking device may determine two-dimensional position information from the three-dimensional position information in some examples and transmit the two-dimensional information to a computing endpoint.

In some examples, signals from each of the receiver coils may first be passed to one or more analog filters followed by one or more analog-to-digital converters to convert analog signals to digital signals prior to processing. In such examples, signal processing circuitry may include one or more digital signal processing circuits. Calibration can optionally be applied. The digital signals can be utilized by signal processing circuitry to perform tracking of the object tracking device, such as by using six degrees of freedom tracking techniques.

According to some embodiments, position tracking circuitry associated with a sensor including three receiver coils utilizes a dipole model to determine position information for the object tracking device. The position information can be determined based on a voltage and/or flux sensed by each of the receiver coils in response to a magnetic field transmitted by a remote magnetic field transmitter. The position tracking circuitry can operate on the principle that an alternating current with a frequency and a coil will induce a position and orientation dependent voltage in a nearby coil. Thus, an alternating current passed through a transmission coil of the magnetic field transmitter will induce a position and orientation dependent voltage in a corresponding receiver coil and a sensor of the object tracking device. For a fixed coil separation, it is noted that the voltage at the receiver coil can be proportional to the mutual inductance of the coil pair.

Each transmitter coil and corresponding receiver coil are separated by a three-dimensional vector. The distance between the vectors may be called a range. The transmitter and receiver coordinate frames can be represented as rotation matrices. A six degrees of freedom tracking algorithm can include solving for the range, followed by solving for the position, followed by solving for the orientation of the receiver.

The object tracking device can include one or more communication interfaces configured to transmit the position information from the object tracking device to one or more remote computing endpoints. In some examples, the communication interface may include one or more radio frequency transmitters configured to transmit the position information using one or more radio frequencies. By way of example, the communication interface may include a Wi-Fi interface, Bluetooth interface, near field communication (NFC) interface, or other interface configured for a particular communication protocol.

In accordance with some implementations, the object tracking device may include one or more inertial measurement units (IMU). The inertial measurement unit can generate additional information that is used by position tracking circuitry to determine position information for the object tracking device. For example the position tracking circuitry can perform sensor fusion to determine a position of the tracking device based on the output the inertial measurement unit as well as the one or more receiver coils. In other examples, the IMU may be used to determine position independent of the receiver coils, such as at intervals between times when position information is generated by the receiver coils. The inertial measurement unit may generate data indicative of a velocity and/or an acceleration of the object tracking device.

The one or more IMU sensors may generate one or more outputs describing one or more three-dimensional motions of the object tracking device. The inertial measurement unit may be secured to the housing of the object tracking device, for example, with zero degrees of freedom, either removably or irremovably, such that the inertial measurement unit translates and is reoriented as the object tracking device is translated and are reoriented. In some embodiments, the inertial measurement unit may include a gyroscope or an accelerometer (e.g., a combination of a gyroscope and an accelerometer), such as a three axis gyroscope or accelerometer configured to sense rotation and acceleration along and about three, generally orthogonal axes. In some embodiments, the inertial measurement unit may include a sensor configured to detect changes in velocity or changes in rotational velocity of the object tracking device and an integrator configured to integrate signals from the sensor. A net movement may be calculated, for instance by a processor of the inertial measurement unit, based on an integrated movement about or along each of a plurality of axes.

The position tracking circuitry can utilize the output of the one or more IMU sensors to generate position information in example embodiments. In some implementations, the output of the IMU sensor(s) may be used to determine position information between one or more periods for which position information is determined using the one or more receiver coils. For example, the one or more receiver coils may output a field strength that is used to determine position information at one or more intervals. Between the time periods of the one or more intervals, an output of the IMU sensor(s) may be used to determine position information. In other examples, an output of the IMU sensor and one or more receiver coils may be combined, such as by utilizing sensor fusion to determine position information.

An object tracking device in accordance with some embodiments may include backscatter circuitry configured to passively generate transmissions to one or more computing endpoints including the position information. The backscatter circuitry can operate utilizing one or more wireless radio frequency (RF) signals without requiring an onboard power source to power the backscatter circuitry. For example, a radio frequency transmitter remote from the object tracking device can generate one or more radio frequency signals that are utilized by the backscatter circuitry onboard the object tracking device. The one or more radio frequency signals can be a single frequency tone in some examples. The backscatter circuitry can perform digital baseband operations such as coding and modulation to encode the position information using the RF signal transmitted from the remote RF transmitter. The backscatter circuitry can reflect and/or absorb the RF signal using a digital switch or other appropriate components. In some examples, the backscatter circuitry is implemented using digital electronics exclusively, without analog components, to decrease power requirements.

The backscatter circuitry may include a frequency synthesizer, baseband processor, and/or backscatter modulator in example embodiments. The frequency synthesizer can generate a baseband clock signal that can be utilized for baseband processing. The frequency synthesizer may additionally generate one or more reference clock signals (e.g., four phases of a reference clock signal for phase-shift keying or other digital modulation scheme). In some examples, the frequency synthesizer can generate the baseband clock signal and reference clock signal utilizing one or more radio frequency signals received by the backscatter circuitry. In this manner, a single frequency RF tone can be received by the frequency synthesizer and be used for the baseband processing and frequency modulation. In some examples, a dedicated device is used to generate the single frequency RF tone. In other examples, the backscatter circuitry can utilize any available RF signal in the environment. The backscatter circuitry can leverage existing signals to provide power and the communication media (e.g., a baseband signal). In this manner, the backscatter circuitry can operate without a power source such as a battery. Instead, the backscatter circuitry can derive all needed power from ambient RF signals, effectively communicating by backscattering the existing wireless signals.

The backscatter circuitry can encode the position information based on the baseband clock signal generated by the frequency synthesizer. For example, the backscatter circuitry can include a baseband processor that generates one or more data packets according to a specified protocol. By way of example, the baseband processor can generate one or more Wi-Fi data packets or one or more Bluetooth data packets using the baseband clock signal. The backscatter modulator can generate an output signal that includes the encoded position information. For example, the backscatter modulator can mix the data packets with the reference clock signal to generate an output backscatter signal. More particularly, the backscatter modulator can mix the baseband packets with the reference clock signal to generate phase modulated data that encodes the data packets. The backscatter modulator can backscatter the radio frequency signal based on the phase modulated data. Thus, the output signal can be a backscatter signal generated by modulating a radio frequency signal generated by a remote device external to the object tracking device. In this manner, the backscatter circuitry can encode the position information in the one or more output backscatter signals with little or no power requirements. Instead, the backscatter circuitry can harvest the power from the remotely generated RF signal transmission and utilize backscatter techniques to modulate the signal to generate the backscatter output signal.

In accordance with some implementations, additional backscatter circuitry may be utilized to harvest power from one or more radio frequency signals in the environment external to an object tracking device. For example, the backscatter circuitry can receive one or more radio frequency signals and harvest power from the associated signal. The power can be used by various electronics onboard the object tracking device, such as a power position tracking circuitry, signal processing circuitry, one or more communication interfaces, and/or an inertial measurement unit. In some examples, the power harvested using the backscatter circuitry can be stored using one or more onboard power storage devices such as a battery or other power storage unit.

A number of use cases in association with a computing environment including an object tracking system according to example embodiments are contemplated. For example, an object tracking device may be implemented as one or more familiar writing instruments such as a pen, marker, pencil, stylus, or any other writing type instrument to generate an object tracking device that can be tracked accurately enough to digitize movement to recognize handwriting or other inputs. In some embodiments, generating the handwriting data can include utilizing a stroke-recognition algorithm, character-recognition algorithm, handwriting-recognition algorithm, and/or the like to analyze at least a portion of the position information. A visual representation of a user's handwriting can be provided in example embodiments. In other example embodiments, user handwriting can be analyzed for text recognition. Moreover, control commands can be provided using handwriting.

Because of the passive nature of the object tracking device, such an instrument can be inexpensively implemented for ubiquitous use and placement to facilitate ease of use by multiple users. This can be contrasted with expensive processor and/or field transmitter-based systems. In some examples, an object tracking device may not require charging, set up, login, or other special ministrations, and may be inexpensive enough to be interchangeable and ubiquitous. Millimeter level accuracy can be achieved that enables a nearly user interface-less input method.

In some examples, a powered base station or transmission hub can track the relative position and orientation of multiple passively powered object tracking devices in a privacy preserving manner and with sufficient accuracy to capture ordinary handwriting at meters-level distances from the powered transmitter (e.g., transmission hub or base station). According to some implementations, a transmission hub can include a magnetic field transmitter and a computing endpoint. An object tracking device can sense one or more magnetic fields generated by the magnetic field transmitter and determine a position of the object tracking device based on the strength of the one or more magnetic fields. The object tracking device can transmit position information to the computing endpoint at the transmission hub. In some examples, the transmission hub may additionally include one or more RF transmitters configured to transmit RF signals used by backscatter circuitry in the object tracking devices.

The user of the object tracking device can provide input to cause transmission of the position information or data derived from position information to one or more additional computing endpoints. For example, a user may tap their smartphone or other client device to the transmission hub to cause transmission of the position information or data derived from position information (e.g., handwriting data) to the user's client device. In another example the user may tap their client device on the transmission hub to cause transmission of the position information or data derived from the position information to another computing endpoint, such as a remote server associated with a user account, for example. Other inputs may be provided by a user to indicate that position information and/or data derived from the position information should be transmitted to a particular computing endpoint.

According to some implementations, a user can access an object tracking device, such as may be incorporated into a pen or other stylus-like device, and begin writing without pairing of the object tracking device to the user or client device associated with the user. The object tracking device can automatically transmit position information to a transmission hub or other computing endpoint in some examples. The transmission hub may include a computing endpoint that initiates one or more actions in response to the position information. For example, the computing endpoint can store the position information and/or transcribe the position information to determine handwriting data. In some examples, without user authorization, the position information and any derived data may be discarded. The handwriting data may include a two-dimensional visual representation of the position information in some examples. In other examples, the handwriting data may include handwriting recognition data. In some examples, a user may provide a simple input to cause the position information and/or handwriting data to be associated with the user. For example, an input can be provided to automatically transmit the information to one or more applications or accounts associated with the user. In some examples, a physical indication such as a tap to the transmission hub by the object tracking component can cause the position information associated with object tracking component to be associated with a device or user. For instance, a user may tap the object tracking device and their smartphone to a transmission hub within a threshold time of one another. As another example, the transmission hub may perform handwriting recognition to recognize a signature provided by the user and automatically associate data from the object tracking device with the user. In yet another example, the transmission hub can provide a pattern to the user for the user to write in order to be associated with the user account. The transmission hub can then transmit position information and/or handwriting data to the client device of the user or to a remote server for example (e.g., to be stored in association with a user account). In this manner, a user may seamlessly use the object tracking device while also ensuring privacy of the information generated by the object tracking device and/or computing endpoint.

As another example, a user may utilize an object tracking device incorporated within a stylus or other pen-type instrument to generate a list. In some examples, the user may provide control information by writing with the stylus. For example, a user may underline items in the list to associate a particular action with the item that is underlined. For instance, the user may generate an ingredient list for a recipe and underline the items to indicate that they should be added to a shopping list. In such an example, the position information can be transmitted from the object tracking device to a computing end point such as a smart home device. The smart home device can utilize handwriting recognition to read the items from the list and generate a shopping list for the user. In some examples, the smartphone device can ask the user to confirm quantities or other information associated with the list. In some examples, the user can instruct the smart home device to place an order for the items on the list.

In another example, an object tracking system in accordance with example embodiments can be utilized in a teaching or other interactive environment. Users such as students may utilize an object tracking device such as a stylus to complete an assignment while in a classroom with other students and a teacher. Position information associated with each object tracking device from the students can be transmitted to a computing endpoint. The computing endpoint can perform handwriting recognition using the position information. The computing endpoint can analyze the text from the handwriting recognition to identify mistakes in the students' work. The teacher can be alerted to a mistake on a computing device associated with the teacher. This can enable teachers to focus on a particular student to see problems that arise, allowing the teacher to see what particular students are struggling and provide individualized attention in the moment.

In yet another example, a group of users may utilize flipcharts to prepare notes during a group meeting. Multiple teams within a group may generate separate flipcharts. As each team presents their findings to the group, a facilitator can capture their own notes on a whiteboard or other flipchart. A computing endpoint can capture all of these notes as they happen by utilizing handwriting recognition based on position information received from object tracking devices used by each of the individual users when preparing the flipcharts or writing on the whiteboard. Text can be generated for each of the user inputs so that the various members of the group can review each member's notes after the meeting. Indeed, because the position information can be associated with a time, the notes can be played back to relive each session in real-time.

In a further example, an object tracking device can be incorporated within a toy or other object. Position information can be generated by the object tracking device while a user such as a child interacts with the toy or other object. The position information can be transmitted to a computing endpoint such as a smart home computing device or a smartphone. The smart home device can analyze the position information to generate actions based on movement of the one or more objects. For example, the smart home device can associate sound effects with particular movements or interactions of objects. For instance, as an object such as a car is moved by a user, the smart home device can make car like noises. When one object comes in contact with another object the smartphone device can initiate a sound effect such as a crashing noise.

As another example, an object tracking device may be used to determine measurements. For example, a stylus may be moved and a computing endpoint can provide feedback indicating a distance, angle, or other measurement associated with the movement. In this manner, a user may utilize an object tracking device to prepare scaled drawings or other drawings with a measured input.

In some implementations, in order to obtain the benefits of the techniques described herein, the user may be required to allow the collection and analysis of location information associated with the user or her device. For example, in some implementations, users may be provided with an opportunity to control whether programs or features collect such information. If the user does not allow collection and use of such signals, then the user may not receive the benefits of the techniques described herein. The user can also be provided with tools to revoke or modify consent. In addition, certain information or data can be treated in one or more ways before it is stored or used, so that personally identifiable information is removed. As an example, a computing system can obtain real-time location data which can indicate a location, without identifying any particular user(s) or particular user computing device(s).

Moreover, multiple object devices in accordance with some embodiments may generate position information in a privacy preserving manner. The position information may be transmitted to an endpoint computing device such as a transmission hub without user identifying information in some examples. The position information can remain private unless shared by the user. In some instances, position information may be transmitted to a transmission hub from one or more object tracking devices. The transmission hub may keep the position information and any data derived from the position information (e.g., handwriting data) private unless indicated to share the data by a user. For instance, the user may provide an indication to the transmission hub to cause the transmission hub to transmit the data to another computing endpoint, such as the user's client device or to a remote server where the data can be associated with the user.

Embodiments of the disclosed technology provide a number of technical effects and benefits, particularly in the areas of computing technology and object tracking. Position information is generated by an object tracking device using low-power and efficient hardware and processing techniques. Such techniques provide a low-cost and effective device for generating position information, such as can be used for handwriting recognition. For example, an object tracking device can include a sensor that comprises one or more magnetic field receiver coils. Receiver coils can be powered with small power requirements, thus enabling devices to be operable for long periods of time using a small on-board power source. Moreover, such techniques minimize hardware on the object tracking device. This enables a small form-factor device to be achieved. For instance, a stylus having the same or similar form factor to an everyday pen can be generated that includes a sensor for magnetic field tracking.

In accordance with example embodiments, a magnetic field transmitter is disposed remotely from the object tracking device to enable a reduced set of hardware and power requirements for the object tracking device. The magnetic field transmitter can generate one or more magnetic fields, enabling the object tracking device to perform object tracking using an onboard receiver rather than an onboard transmitter. An onboard receiver may utilize less circuitry and/or less power than a transmitter that generates a magnetic field. For example, an onboard receiver may not include power amplifiers and/or signal generators associated with magnetic field generation or other object tracking techniques.

According to some aspects, an object tracking device can include backscatter circuitry to further reduce hardware and/or power requirements of an object tracking device. Backscatter circuitry can operate on wireless radio frequency signals to generate modulated output signals without requiring a power input. The backscatter circuitry can generate a baseband signal utilizing an input RF signal from one or more remote devices such as a remote RF transmitter. Backscatter circuitry can encode position information using the remotely-generated RF signal. In this manner, the backscatter circuitry can generate transmissions including the position information without requiring onboard power source to facilitate the transmission.

With reference now to the figures, example aspects of the present disclosure will be discussed in greater detail.

FIG. 1 depicts a block diagram of an example computing environment including an object tracking system with a magnetic field receiver in accordance with example embodiments of the present disclosure. FIG. 1 depicts an object tracking system 102 including a magnetic field transmitter 130 that generates a stationary magnetic field 132 (e.g., electromagnetic field) using one or more magnetic transmitter coils. A pair of object tracking devices 110 are positioned remote from the magnetic field transmitter 130. The pair of object tracking devices 110 are positioned within a volume defined by the magnetic field 132. A pair of object tracking devices are depicted by way of example only. It will be appreciated that one or any number of object tracking devices may be used in accordance with example embodiments. More particularly one or more object tracking devices may be used in accordance with a single magnetic field or set of magnetic fields in accordance with example embodiments.

Object tracking devices 110 are in communication with a computing endpoint 150 over one or more networks 170. The network(s) 170 can be any type of communications network, such as a local area network (e.g., intranet), wide area network (e.g., Internet), or some combination thereof and can include any number of wired or wireless links. In general, communication over the network 170 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

Magnetic field transmitter 130 can include one or more transmitter coils that generate one or more stationary magnetic fields 132. The stationary magnetic field(s) can have a known geometry. By way of example, a magnetic field transmitter may include three transmitter coils configured to generate three orthogonal magnetic fields. In some examples, each magnetic field has a frequency of about 100 KHz. Other frequencies including those in lower frequency ranges (e.g., such as in a range of about 40 KHz to 70 kHz) or higher frequency ranges (e.g. GHz) can be used. A magnetic field in some examples has a radius greater than 0.5 m. For instance, the magnetic field can have a radius greater than 1.0 m, such as greater than 2.0 m, such as greater than about 3.0 m, such as greater than about 4.0 m, such as greater than about 5.0 m.

The object tracking devices 110 can localize an internal sensor with respect to the one or more magnetic field(s) which have a known geometry. For example, the size and/or shape of the magnetic field(s) may be known. The sensor can include a receiver having one or more receiver coils configured to sense the one or more magnetic field(s). In some examples, the receiver includes three receiver coils each associated with an individual one of the three orthogonal magnetic fields. Each receiver coil can sense the corresponding magnetic field using magnetic induction. According to some implementations, the object tracking device can sense the one or more magnetic fields without having a line of sight between the device and the magnetic field source. Using three receiver coils and three corresponding magnetic fields, object tracking system 102 can implement an inexpensive six degrees of freedom (DoF) tracking system.

Object tracking devices 110 can include one or more communication interfaces configured to transmit position information to one or more computing endpoints 150. A computing endpoint 150 can be a remote computing device, such as a remote server or client device. The object tracking device can transmit the position information to the one or more computing endpoints over one or more networks 170. For example, an object tracking device can transmit position information to a remote user computing device or a remote server over one or more local Wi-Fi networks, bluetooth networks, or NFC networks. In such examples, the object tracking device can include a radio frequency transmitter. In other examples, the object tracking device can include backscatter circuitry that can modulate position information using one or more remotely generated radio frequency signals. In such examples, the object tracking device may not include a radio frequency transmitter and can generate backscatter signals without requiring an onboard power source to power transmission of the position information. In some examples, magnetic field transmitter 130 and computing endpoint 150 can be disposed with a common housing. In such cases, the housing can be stationary and provide an all-in-one solution for a room or other area. For instance, the housing may include a connector configured to be configured to receive power from a wall outlet. In other examples, the housing can be a lightbulb housing in which the components are disposed. It is noted that the housing can have one or more first surfaces. The object tracking devices 110 can write on one or more second surfaces that are remote from the housing and the one or more first surfaces. In this manner, a user does not need to write on the surface of the device providing the magnetic field transmitter or computing endpoint.

Figure 2:
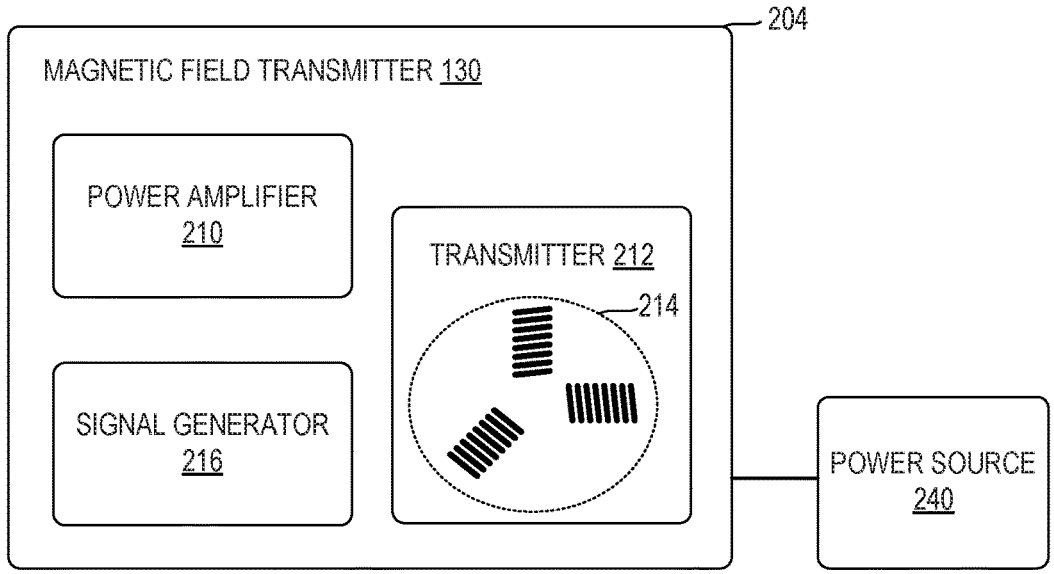
FIG. 2 depicts a block diagram of an example magnetic field transmitter in accordance with example embodiments of the present disclosure.

FIG. 2 depicts a block diagram of an example magnetic field transmitter in accordance with example embodiments of the present disclosure. Magnetic field transmitter 130 may include a power amplifier 210, signal generator 216, and transmitter 212 including one or more transmitter coils 214. The power amplifier 210, signal generator 216, and transmitter 212 can be disposed at least partially within a housing 204. The magnetic field transmitter 130 can be coupled to an external power source 240. In some examples, a magnetic field transmitter 130 may operate from a standard power source such as 60 Hz and 120 V AC to produce one or more magnetic fields using one or more transmitter coils. The signal generator 216 can generate one or more signals such as an alternating current having a specified frequency to induce a magnetic field when the alternating current is passed through a transmission coil. In some examples, the transmitter may include three transmitter coils 214. The three transmitter coils 214 can be disposed orthogonally to one another to generate three orthogonal magnetic fields in example embodiments. In some examples, a different frequency can be used for the alternating current of each transmitter coil. In other examples, the same frequency can be used for each transmitter coil. In yet another example, the frequency for or an individual one of the transmitter coils may be varied such as by frequency hopping to generate unique frequency magnetic fields for tracking individual ones of a plurality of object tracking devices.

The housing 204 of a magnetic field transmitter 130 can be configured in various manners according to the requirements of a particular implementation. In some examples, a magnetic field transmitter can be a stand-alone device. In other examples, the magnetic field transmitter can be incorporated within other electric components such as a lightbulb, a light switch, a smoke alarm, or a computing device such as laptop, smartphone, server, or smartphone device, etc. The magnetic field transmitter can easily be positioned within a room or other area to provide one or more magnetic fields for use by one or more object tracking devices within the room or area. According to some aspects, a magnetic field transmitter can be provided in a common housing with a computing endpoint to provide a magnetic transmission hub. In some examples, a magnetic field transmitter can be disposed in a common housing with an RF transmitter. In some examples, a magnetic field transmitter, a computing endpoint, and an RF transmitter can be disposed within or at least partially within a common housing.

Figure 3:
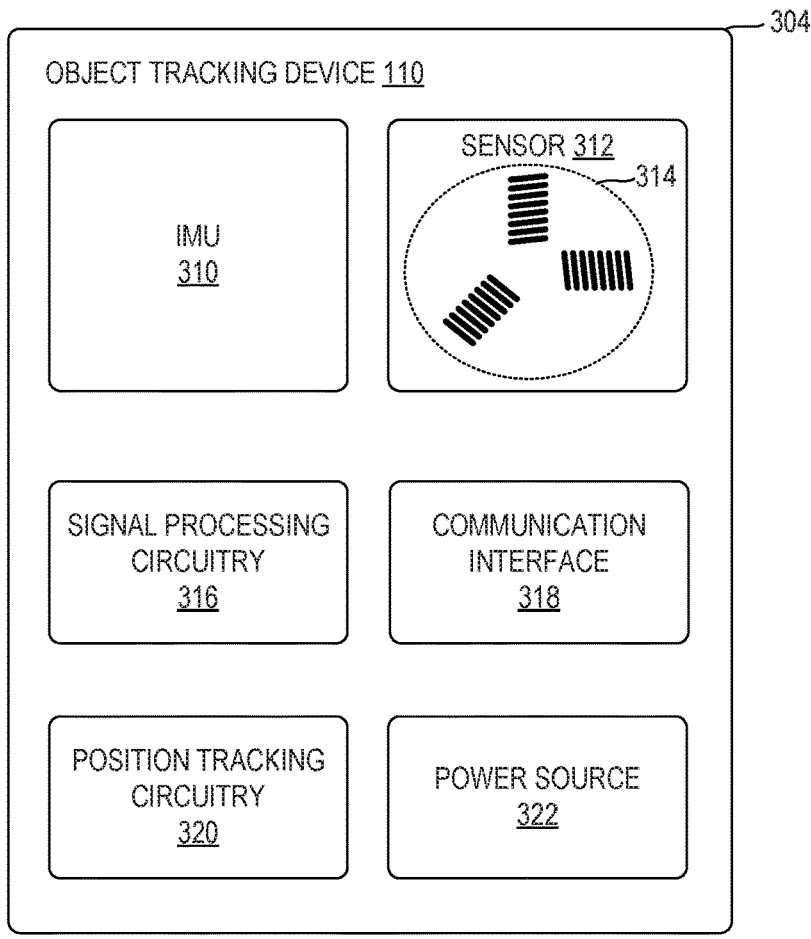
FIG. 3 depicts an example of an object tracking device in accordance with example embodiments of the present disclosure.

FIG. 3 depicts an example of an object tracking device in accordance with example embodiments of the present disclosure. Object tracking device 110 can include an inertial measurement unit 310, sensor 312, signal processing circuitry 316, communication interface 318, position tracking circuitry 320, and a power source 322 arranged within an exterior housing 304. The exterior housing may include numerous form factors according to the requirements of various implementations. By way of example, the exterior housing may be formed in the shape of a pencil, stylus, or other user input mechanism. In other examples, the exterior housing may not be formed as a user input mechanism, such as where the object tracking mechanism is used for location tracking of commodities. For instance, the object tracking device 110 may be embedded within, attached to, or otherwise coupled with any type of object to provide object tracking capabilities. Power source 322 may include a battery or other suitable source of onboard power for object tracking device 110.

The object tracking device can include a sensor 312 comprising one or more receiver coils 314 and associated circuitry to determine a magnetic field strength sensed by the one or more receiver coils. For example, the sensor may include a set of three orthogonally oriented receiver coils, each configured to sense a different one of a set of three orthogonal magnetic fields.

The object tracking device can include signal processing circuitry 316 configured to process the signal from each of the receiver coils. In some examples, the signal processing circuitry 316 can determine a signal strength or field strength associated with each of the receiver coils 314. The signal processing circuitry 316 can include one or more amplifiers and associated circuitry for determining a strength and orientation associated with each of the magnetic fields. The field strength can indicate the strength of the magnetic field sensed by the respective receiver coil.

Position tracking circuitry 320 can determine the position of the object tracking device based on the field strength associated with each of the receiver coils. For example, the object tracking device 110 may determine object movement and position information by determining the relative strength of each of the three orthogonal magnetic fields. Based on the relative strength of each of the magnetic fields, the position tracking circuitry can determine a position of object tracking device in space. In some examples, the position information determined by the position tracking circuitry is three-dimensional position information, for example indicating a three-dimensional coordinate for each of the positions of the object tracking device. In other examples, the position information may be two-dimensional position information such as a two-dimensional coordinate. The object tracking device 110 may determine two-dimensional position information from the three-dimensional position information in some examples and transmit the two-dimensional information to a computing endpoint. In other examples, the object tracking device may transmit three-dimensional position information.

In some examples, signals from each of the receiver coils 314 may first be passed to one or more analog filters followed by one or more analog-to-digital converters to convert analog signals to digital signals prior to processing. In such examples, signal processing circuitry may include one or more digital signal processing circuits. Calibration can optionally be applied. The digital signals can be utilized by signal processing circuitry to perform tracking of the object tracking device such as by using six degrees of freedom tracking techniques.

According to some embodiments, position tracking circuitry 320 associated with a sensor including three receiver coils utilizes a dipole model to determine position information for the object tracking device. The position information can be determined based on a voltage and/or flux sensed by each of the receiver coils in response to a magnetic field transmitted by a remote magnetic field transmitter. The position tracking circuitry 320 can operate on the principle that an alternating current with a frequency and a coil will induce a position and orientation dependent voltage in a nearby coil. Thus, an alternating current passed through a transmission coil of the magnetic field transmitter will induce a position and orientation dependent voltage in a corresponding receiver coil and a sensor of the object tracking device. For a fixed coil separation, it is noted that the voltage at the receiver coil is proportional to the mutual inductance of the coil pair.

Each transmitter coil 214 and corresponding receiver coil 314 are separated by a three-dimensional vector. The distance between the vectors may be called a range. The transmitter and receiver coordinate frames can be represented as rotation matrices. A six degrees of freedom tracking algorithm can include solving for the range, followed by solving for the position, followed by solving for the orientation of the receiver.

The object tracking device can include one or more communication interfaces 318 configured to transmit the position information from the object tracking device to one or more remote computing endpoints. In some examples, the communication interface 318 may include one or more radio frequency transmitters configured to transmit the position information using one or more radio frequencies. By way of example, the communication interface 318 may include a Wi-Fi interface, Bluetooth interface, or other interface configured for a particular communication protocol. In other examples, the communication interface 318 may include backscatter circuitry. The communication interface enables wireless communication of data 1008 (e.g., received data, data that is being received, data scheduled for broadcast, data packets of the data, etc.). Communication interfaces can be implemented as any one or more of a serial and/or parallel interface, a wireless interface, any type of network interface, a modem, and as any other type of communication interface. Communication interfaces provide a connection and/or communication links between object tracking device 110 and a communication network by which other electronic, computing, and communication devices communicate data.

In accordance with some implementations, the object tracking device 110 may include one or more inertial measurement units 310 (IMU). The inertial measurement unit(s) can generate additional information that is used by position tracking circuitry to determine position information for the object tracking device. For example the position tracking circuitry 320 can perform sensor fusion to determine a position of the tracking device based on the output the inertial measurement unit 310 as well as the one or more receiver coils 314. In other examples, the IMU 310 may be used to determine position independent of the receiver coils 314, such as at intervals between times when position information is generated by the receiver coils. The inertial measurement unit may generate data indicative of a velocity and/or an acceleration of the object tracking device.

The one or more IMU(s) 310 may generate one or more outputs describing one or more three-dimensional motions of the object tracking device. The inertial measurement unit may be secured to the housing 304 of the object tracking device, for example, with zero degrees of freedom, either removably or irremovably, such that the inertial measurement unit translates and is reoriented as the object tracking device is translated and are reoriented. In some embodiments, the inertial measurement unit(s) 310 may include a gyroscope or an accelerometer (e.g., a combination of a gyroscope and an accelerometer), such as a three axis gyroscope or accelerometer configured to sense rotation and acceleration along and about three, generally orthogonal axes. In some embodiments, the inertial measurement unit may include a sensor configured to detect changes in velocity or changes in rotational velocity of the object tracking device and an integrator configured to integrate signals from the sensor such that a net movement may be calculated, for instance by a processor of the inertial measurement unit, based on an integrated movement about or along each of a plurality of axes.

The position tracking circuitry 320 can utilize the output of the one or more IMU sensors to generate position information in example embodiments. In some implementations, the output of the IMU sensor(s) may be used to determine position information between one or more periods for which position information is determined using the one or more receiver coils. For example, the one or more receiver coils may output a field strength that is used to determine position information at one or more intervals. Between the time periods of the one or more intervals, an output of the IMU sensor(s) may be used to determine position information. In other examples, an output of the IMU sensor and one or more receiver coils may be combined, such as by utilizing sensor fusion to determine position information.

Figure 4:
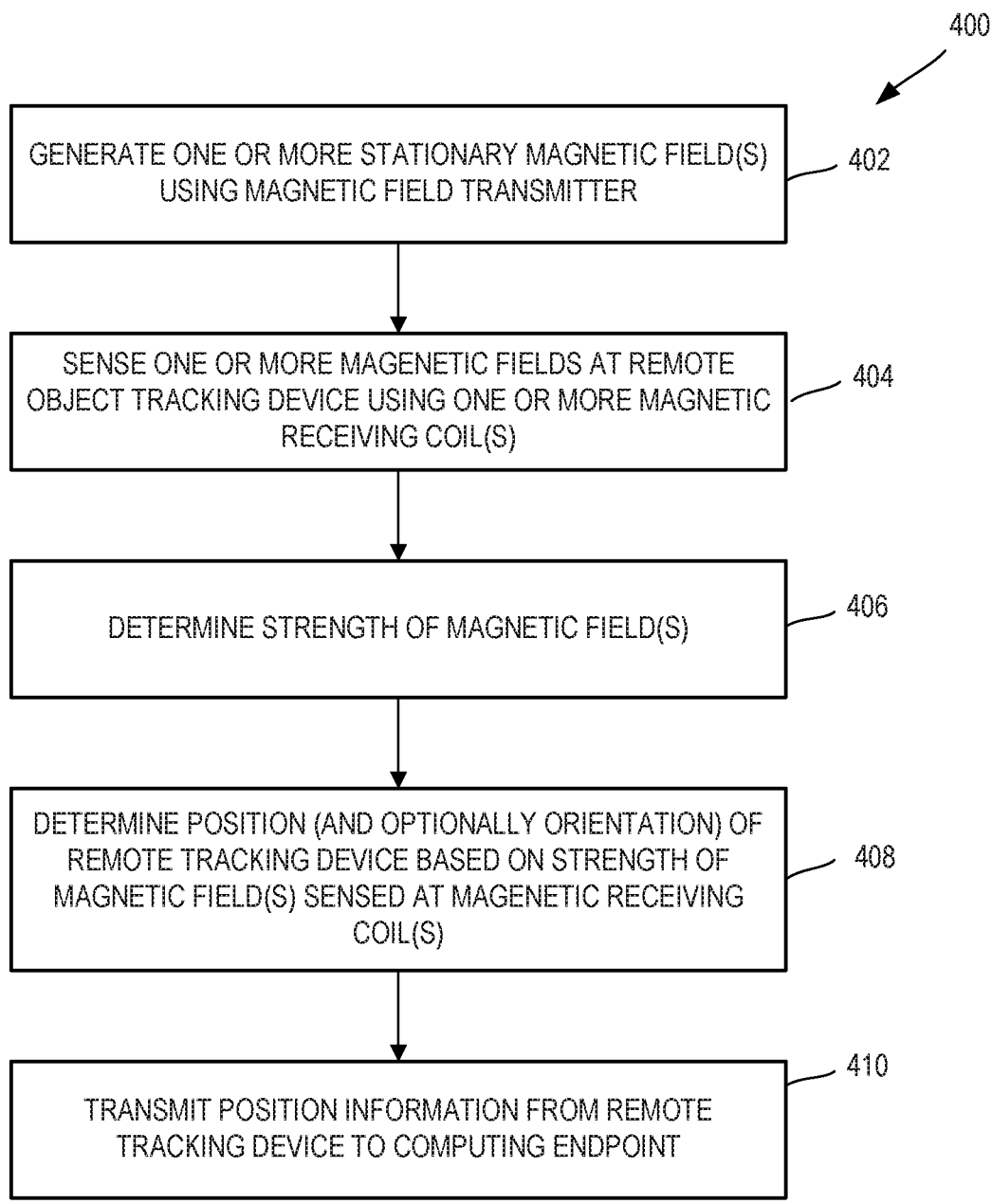
FIG. 4 is a flowchart depicting an example method of tracking an object including a magnetic field receiver in accordance with example embodiments of the present disclosure.

FIG. 4 is a flowchart depicting an example method of tracking an object including a magnetic field receiver in accordance with example embodiments of the present disclosure. Although FIG. 4 depicts steps performed in a particular order for purposes of illustration and discussion, method 400 of FIG. 4 and the other methods described hereinafter (e.g., methods 450 and 500) are not limited to the particularly illustrated order or arrangement. The various steps of the methods disclosed herein can be omitted, rearranged, combined, and/or adapted in various ways without deviating from the scope of the present disclosure.

At (402), one or more stationary magnetic fields (e.g., electromagnetic fields) are generated using a magnetic field transmitter. In example embodiments, three orthogonal magnetic fields can be generated by a magnetic field transmitter at 402. In some embodiments, the magnetic fields have a frequency in a range of 40 Hz to 70 Hz. In other embodiments, the magnetic fields have a frequency greater than 70 Hz, such as 100 Hz or in the gigahertz range.

At (404), the one or more magnetic fields are sensed by an object tracking device remote from the magnetic field transmitter. The object tracking device may include a sensor including one or more magnetic receiving coils configured to sense the one or more stationary magnetic fields generated using the magnetic field transmitter. In example embodiments, the sensor includes three receiving coils configured orthogonally to one another to sense a strength associated with three orthogonal magnetic fields generated by the magnetic field transmitter.

At (406), a strength of each of the one or more magnetic fields is determined. An object tracking device can include signal processing circuitry configured to process the signal from each of the receiver coils. In some examples, the signal processing circuitry can determine a signal strength or field strength associated with each of the receiver coils. The field strength can indicate the strength of the magnetic field sensed by the respective receiver coil.

At (408), the position (and optionally orientation) of the object tracking device is determined based on the strength of the one or more magnetic fields sensed by the one or more magnetic receiving coils. An object tracking device can include position tracking circuitry configured to determine the position and orientation of the object tracking device based on the strength of the one or more magnetic fields.

At (410), the position information is transmitted from the object tracking device to one or more computing endpoints. In some examples, the object tracking device utilizes one or more RF transmitters to transmit one or more data packets including the position information. In other examples, the object tracking device includes backscatter circuitry configured to generate a modulated output signal based on a remotely generated RF signal. In such embodiments the position information to be transmitted from the object tracking device without requiring an onboard power source.

Figure 5:
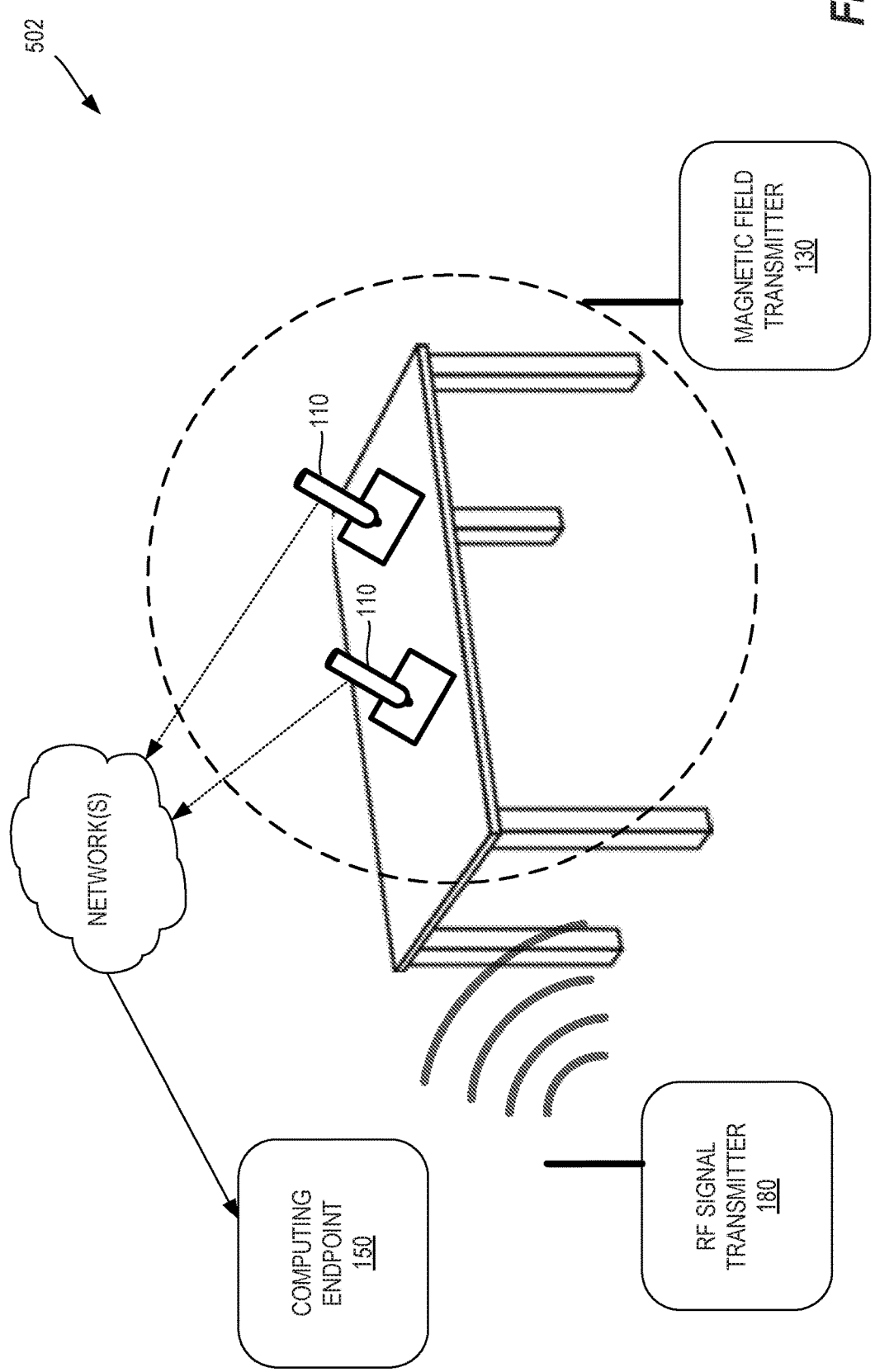
FIG. 5 depicts a block diagram of an example computing environment including an object tracking system that uses backscatter technology in accordance with example embodiments of the present disclosure.

FIG. 5 depicts a block diagram of an example computing environment including an object tracking system that uses backscatter technology in accordance with example embodiments of the present disclosure. FIG. 5 depicts an object tracking system 502 including a magnetic field transmitter 130, stationary magnetic field 132 generated by magnetic field transmitter, network(s) 170, object tracking device 110, and one or more RF signal transmitters 180. The various devices depicted in FIG. 5 can be the same as those depicted in FIG. 1 in example embodiments. According to some aspects, magnetic field transmitter 130 can be disposed within common housing with computing endpoint 150 and/or RF signal transmitter 180.

Object tracking devices 110 can include backscatter circuitry that can modulate position information using one or more remotely generated radio frequency signals by RF signal transmitter 180. The object tracking devices may not necessarily include a radio frequency transmitter and can generate backscatter signals without requiring an onboard power source to power transmission of the position information. In some examples, backscatter circuitry of object tracking devices 110 can reflect or absorb existing RF signals in the environment external to object tracking device 610. Object tracking devices 110 can generate backscatter signals including Wi-Fi, Bluetooth, or NFC data packets in some examples. Object tracking devices 110 can communicate backscatter signals over one or more networks 170 in some examples. Although object tracking devices 110 are depicted as generating transmissions using networks 170, in other examples backscatter circuitry within the object tracking devices may reflect or otherwise generate an output signal directly to one or more computing endpoints 150.

RF signal transmitter can operate at frequencies in the MHz range. By way of example, RF signal transmitter 180 can generate signals having a frequency of about 1 MHz. An RF signal in some examples has a frequency equal to or greater than 1 MHz. For instance, an RF signal can have a frequency greater than 1 MHz, such as greater than about 5 MHz, such as greater than about 10 MHz, such as greater than about 100 MHz. In other examples, the RF signal transmitted can operate at frequencies in the GHz range. By way of example, RF signal transmitter 180 can generate signals having a frequency of about 1 GHz. An RF signal in some examples has a frequency equal to or greater than 1 GHz. For instance, an RF signal can have a frequency greater than 1 GHz, such as greater than about 5 GHz, such as greater than about 10 GHz, such as greater than about 100 GHz. Other frequencies can be used.

Figure 6:
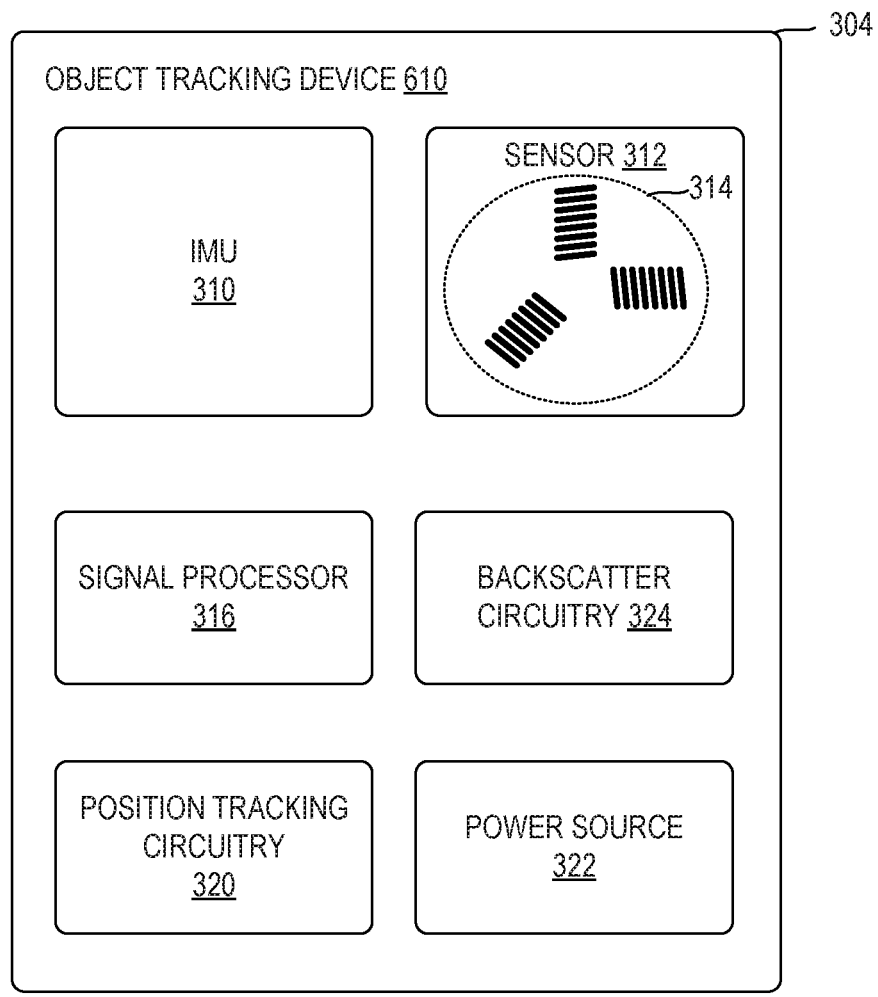
FIG. 6 depicts an example of an object tracking device in accordance with example embodiments of the present disclosure.

FIG. 6 depicts an example of an object tracking device in accordance with example embodiments of the present disclosure. Object tracking device 610 can include an inertial measurement unit 310, sensor 312, signal processing circuitry 316, communication interface 318, position tracking circuitry 320, and a power source 322 arranged within an exterior housing 304 as earlier described.

Object tracking device 610 can additionally include backscatter circuitry 324 configured to passively generate transmissions to one or more computing endpoints including the position information. The backscatter circuitry can operate utilizing one or more wireless radio frequency (RF) signals from an RF signal transmitter (e.g., RF signal transmitter 180) without requiring an onboard power source to power the backscatter circuitry. The backscatter circuitry can utilize any available RF signal in some embodiments. An RF signal transmitter can be remote from the object tracking device and generate one or more radio frequency signals that are utilized by the backscatter circuitry onboard the object tracking device. The one or more radio frequency signals can be a single frequency tone in some examples. The backscatter circuitry 324 can perform digital baseband operations such as coding and modulation to encode the position information using the RF signal transmitted from the remote RF transmitter. The backscatter circuitry 324 can reflect and/or absorb the RF signal using a digital switch or other appropriate components. In some examples the backscatter circuitry is implemented using digital electronics exclusively, without analog components, to decrease power requirements.

Figure 7:
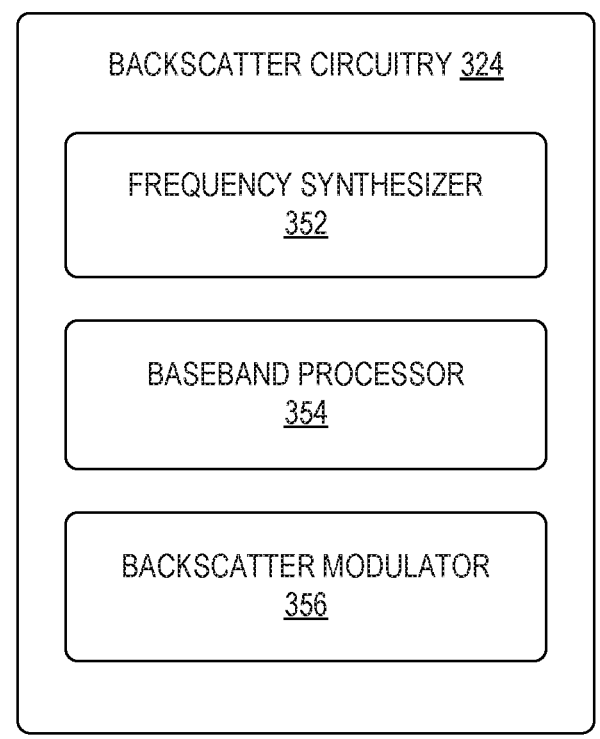
FIG. 7 depicts an example of backscatter circuitry of an object tracking device in accordance with example embodiments of the present disclosure.

FIG. 7 depicts an example of backscatter circuitry 324 of an object tracking device in accordance with example embodiments of the present disclosure. The backscatter circuitry 324 may include a frequency synthesizer 352, baseband processor 354, and/or backscatter modulator 356 in example embodiments. The frequency synthesizer 352 can generate a baseband clock signal that can be utilized for baseband processing. The frequency synthesizer 352 may additionally generate one or more reference clock signals (e.g., four phases of a reference clock signal for phase-shift keying or other digital modulation scheme). In some examples, the frequency synthesizer 352 can generate the baseband clock signal and reference clock signal utilizing one or more radio frequency signals received by the backscatter circuitry. In this manner, a single frequency RF tone can be received by the frequency synthesizer and be used for the baseband processing and frequency modulation. In some examples, a dedicated device is used to generate the signal frequency RF tone. In other examples, the backscatter circuitry can utilize any available RF signal in the environment. The backscatter circuitry 324 can leverage existing signals to provide power and the communication media (e.g., a baseband signal). In this manner, the backscatter circuitry 324 can operate without a power source such as a battery. Instead, the backscatter circuitry 324 can derive all needed power from ambient RF signals, effectively communicating by backscattering the existing wireless signals.

Baseband processor 354 can generate one or more data packets according to a specified protocol. By way of example, the baseband processor 354 can generate one or more Wi-Fi data packets or one or more Bluetooth data packets using the baseband clock signal.

Backscatter modulator 356 can generate an output signal that includes the encoded position information. For example, the backscatter modulator 356 can mix the data packets with the reference clock signal to generate an output backscatter signal. More particularly, the backscatter modulator 356 can mix the baseband packets with the reference clock signal to generate phase modulated data that encodes the data packets. The backscatter modulator 356 can backscatter the radio frequency signal based on the phase modulated data. Thus, the output signal can be a backscatter signal generated by modulating a radio frequency signal generated by a remote device external to the object tracking device. In this manner, the backscatter circuitry 324 can encode the position information in the one or more output backscatter signals with little or no power requirements. Instead, the backscatter circuitry 324 can harvest the power from the remotely generated RF signal transmission and utilize backscatter techniques to modulate the signal to generate the backscatter output signal.

Figure 8:
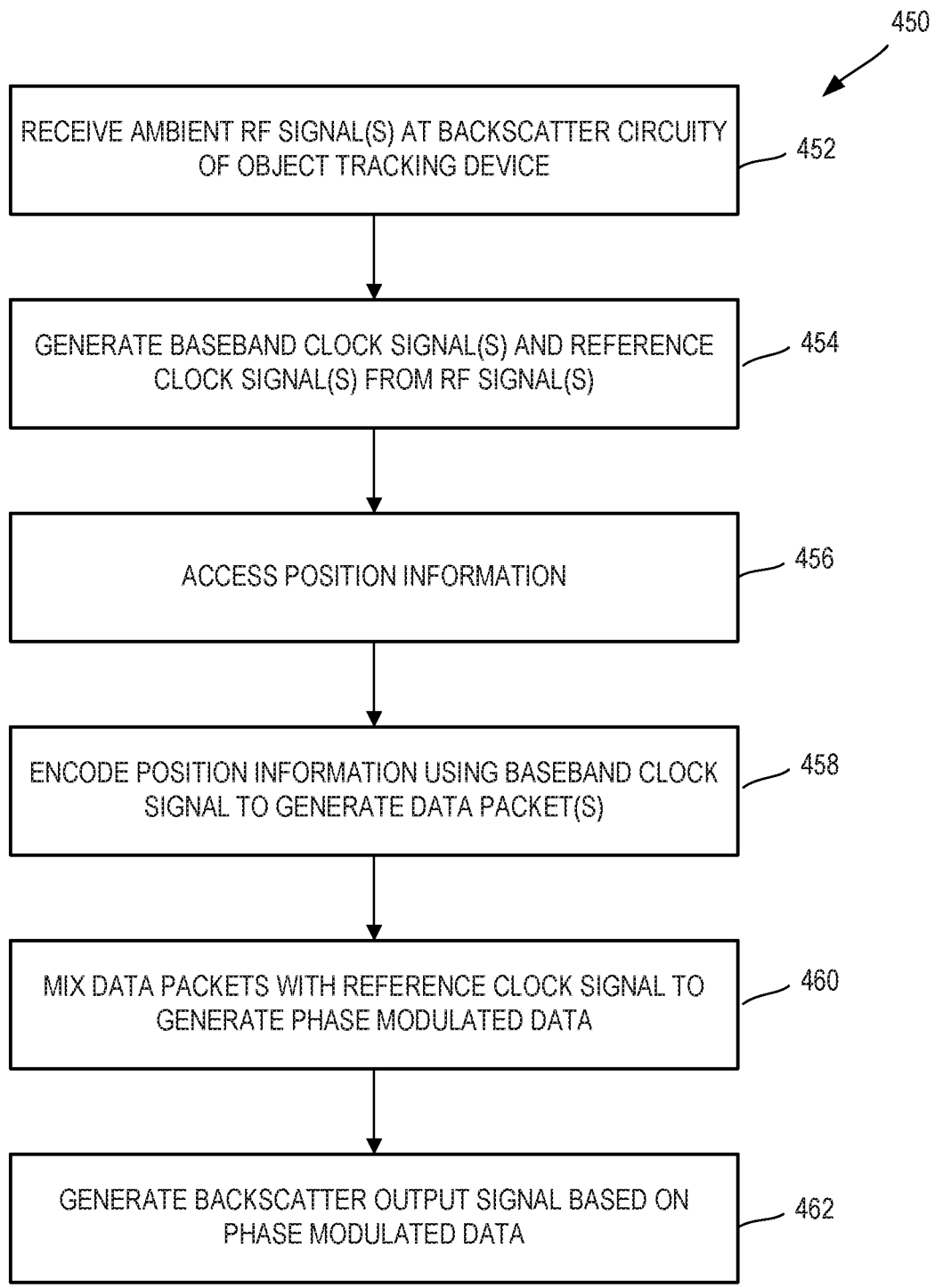
FIG. 8 is a flowchart depicting an example method of generating an output signal that includes position information using backscatter circuitry in accordance with example embodiments of the present disclosure.

FIG. 8 is a flowchart depicting an example method 450 of generating an output signal that includes position information using backscatter circuitry in accordance with example embodiments of the present disclosure.

At (452), one or more ambient radio frequency signals are received by backscatter circuitry of the object tracking device. One or more RF signals may be a single RF frequency tone in some examples. A standalone RF transmitter may be used to generate the RF signals in some examples. In other examples, any existing ambient RF signal in the environment can be used by the backscatter circuitry.

At (454), one or more baseband clock signals and one or more reference clock signals are generated from the one or more RF signals received by the backscatter circuitry. A frequency synthesizer may be used to generate the various clock signals at 454 in example embodiments.

At (456), position information is accessed. The position information may be generated by position tracking circuitry of the object tracking device in example embodiments.

At (458), at least a portion of the position information is encoded using one or more baseband clock signals to generate one or more data packets. One or more data packets may be Wi-Fi data packets, Bluetooth data packets, or NFC data packets in example embodiments. However, any suitable data protocol and corresponding data packet may be used. In example embodiments, a baseband processor may be used to generate one or more data packets at 458.

At (460), the data packets are mixed with the one or more reference clock signals to generate phase modulated data. The phase modulated data may encode the position information using one or more reference clock signals. In example embodiments, the backscatter modulator may be used to generate the phase modulated data at 460.

At (462), one or more backscatter output signals are generated based on the phase modulated data. In various embodiments, the backscatter output signal(s) can be generated without accessing onboard power source of the object tracking device. Rather, the one or more ambient signals can be reflected or absorbed to generate the backscatter output signal. This can include modulating the existing RF signals in the environment using backscatter circuitry so as to avoid generating typical power transmissions.

Figure 9:
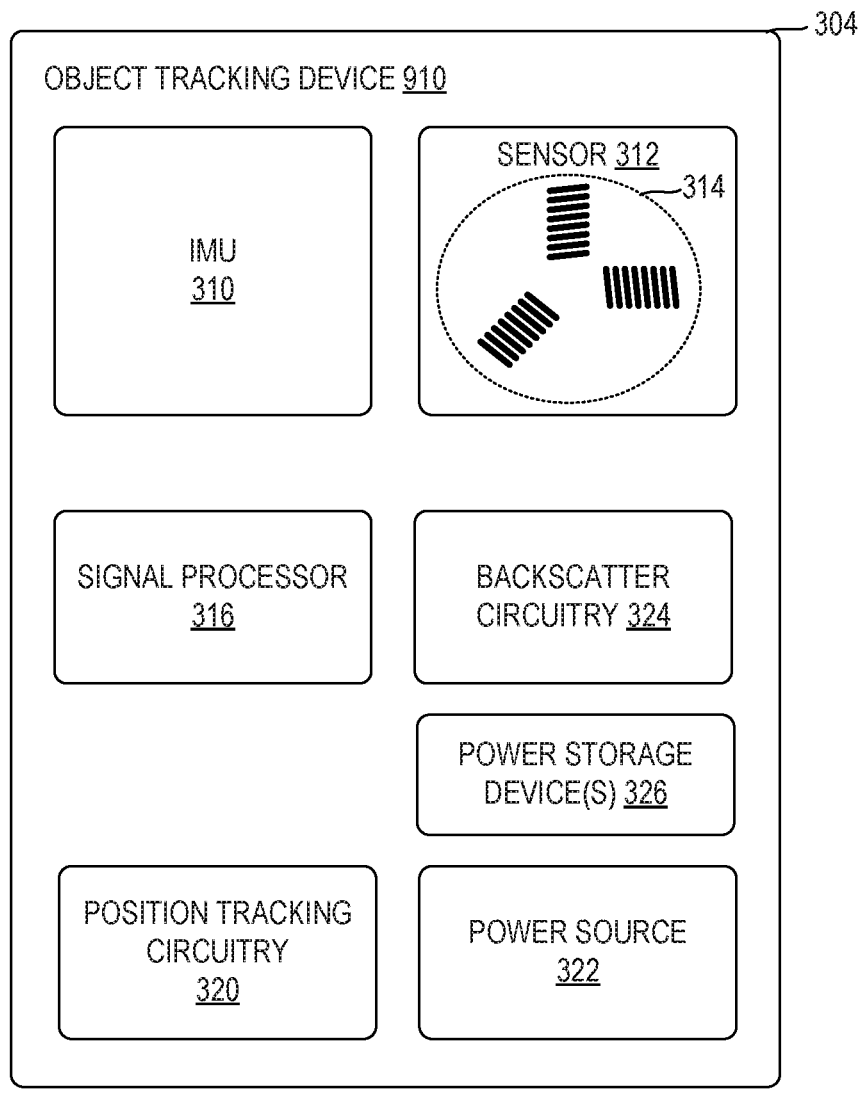
FIG. 9 depicts an example of an object tracking device in accordance with example embodiments of the present disclosure.

FIG. 9 depicts an example of an object tracking device in accordance with example embodiments of the present disclosure. Object tracking device 910 can include an inertial measurement unit 310, sensor 312, signal processing circuitry 316, communication interface 318, position tracking circuitry 320, power source 322, and backscatter circuitry 324 arranged within an exterior housing 304 as earlier described.

In accordance with some implementations, backscatter circuitry 324 may be utilized to harvest power from one or more radio frequency signals in the environment external to an object tracking device. Backscatter circuitry 324 may include additional dedicated backscatter circuitry for power harvesting or may utilize the same circuitry used for generating a backscattered output signal. Backscatter circuitry 324 can receive one or more radio frequency signals and harvest power from the associated signal. The power can be used by various electronics onboard the object tracking device, such as a power position tracking circuitry, signal processing circuitry, one or more communication interfaces, and/or an inertial measurement unit. In some examples, the power harvested using the backscatter circuitry can be stored using one or more onboard power storage device(s) such as a battery, capacitor, or other power storage unit.

Figure 10:
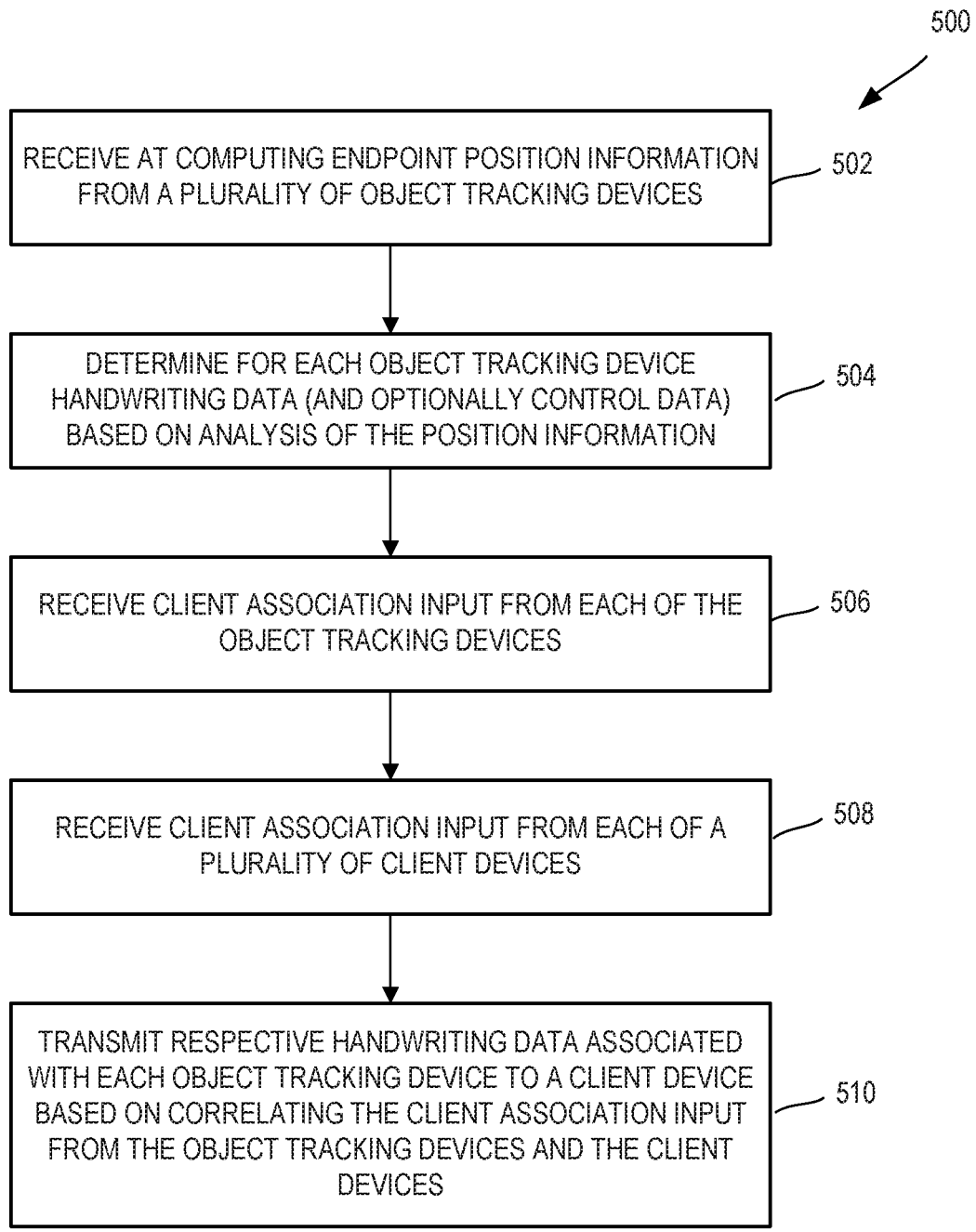
FIG. 10 is a flowchart depicting an example method of tracking multiple object tracking devices associated with a magnetic field transmitter.

FIG. 10 is a flowchart depicting an example method of tracking multiple object tracking devices associated with a magnetic field transmitter.

At (502), position information is received at a computing endpoint from a plurality of object tracking devices. In one example, the computing endpoint is a transmission hub that also includes a magnetic field transmitter in accordance with example embodiments. In some examples, a powered base station or transmission hub can track the relative position and orientation of multiple object tracking devices in a privacy preserving manner and with sufficient accuracy to capture ordinary handwriting at meters-level distances from the powered transmitter (e.g., transmission hub or base station). According to some implementations, a transmission hub can include a magnetic field transmitter and a computing endpoint. An object tracking device can sense one or more magnetic fields generated by the magnetic field transmitter and determine a position of the object tracking device based on the strength of the one or more magnetic fields. The object tracking device can transmit position information to the computing endpoint at the transmission hub. In some examples, the transmission hub may additionally include one or more RF transmitters configured to transmit RF signals used by backscatter circuitry in the object tracking devices.

At (504), the computing endpoint determines for each object tracking device handwriting data, and optionally control data, based on an analysis of the position information. In some examples, the computing endpoint may receive three-dimensional data from the object tracking devices. The computing endpoint may generate two-dimensional data from the three-dimensional data and perform handwriting recognition on the two-dimensional data. In other examples, the object tracking devices may transmit two-dimensional data. For example, object tracking devices may convert sensed three-dimensional data to flattened two-dimensional data which is transmitted to the computing endpoint.

According to some implementations, a user can access an object tracking device, such as may be incorporated into a pen or other stylus-like device, and begin writing without pairing of the object tracking device to the user or client device associated with the user. The object tracking device can automatically transmit position information to a transmission hub or other computing endpoint in some examples. The transmission hub may include a computing endpoint that initiates one or more actions in response to the position information. For example, the computing endpoint can store the position information and/or transcribe the position information to determine handwriting data. In some examples, without user authorization, the position information and any derived data may be discarded. The handwriting data may include a two-dimensional visual representation of the position information in some examples. In other examples, the handwriting data may include handwriting recognition data.

At (506), the computing endpoint may receive client association input from each of the object tracking devices. In one example, the client association input may include a physical tap of an object tracking device to the computing endpoint such as a transmission hub. Other client association inputs may be received at 506.

At (508), the computing endpoint may receive a client association input for each of a plurality of client devices. In one example, the client association input may include a physical tap of a client device to the computing endpoint such as a transmission hub. Such a physical tap may occur within a specified time of tapping the computing endpoint with the object tracking device to create a correlation between the two. In another example, handwriting recognition may be performed on a portion of a user input to associate the object tracking device with a particular user. Various client association inputs may be received at 506.

The user of the object tracking device can provide various inputs to cause transmission of the position information or data derived from position information to one or more additional computing endpoints. For example, a user may tap their smartphone or other client device to the transmission hub to cause transmission of the position information or data derived from position information (e.g., handwriting data) to the user's client device. In another example the user may tap their client device on the transmission hub to cause transmission of the position information or data derived from the position information to another computing endpoint, such as a remote server associated with a user account, for example. Other inputs may be provided by a user to indicate that position information and/or data derived from the position information should be transmitted to a particular computing endpoint.

In some examples, a user may provide a simple input to cause the position information and/or handwriting data to be associated with the user. For example, an input can be provided to automatically transmit the information to one or more applications or accounts associated with the user. In some examples, a physical indication such as a tap to the transmission hub by the object tracking component can cause the position information associated with object tracking component to be associated with a device or user. For instance, a user may tap the object tracking device and their smartphone to a transmission hub within a threshold time of one another. As another example, the transmission hub may perform handwriting recognition to recognize a signature provided by the user and automatically associate data from the object tracking device with the user. In yet another example, the transmission hub can provide a pattern to the user for the user to write in order to be associated with the user account. The transmission hub can then transmit position information and/or handwriting data to the client device of the user or to a remote server for example (e.g., to be stored in association with a user account). In this manner, a user may seamlessly use the object tracking device while also ensuring privacy of the information generated by the object tracking device and/or computing endpoint.

At (510), the computing endpoint transmits the respective handwriting data associated with the object tracking device to a client device or account based on correlating the client association input from object tracking devices and the client association input from the client devices. It is noted that various steps of FIG. 10 are not necessarily performed in order. For example, a single object tracking device may provide a client association input followed by a client device providing a client association input to associate the two. Numerous examples of association inputs may be used to associate position information from a particular object tracking device with a particular user or client device.

As another example, a user may utilize an object tracking device incorporated within a stylus or other pen-type instrument to generate a list. In some examples, the user may provide control information by writing with the stylus. For example, a user may underline items in the list to associate a particular action with the item that is underlined. For instance, the user may generate an ingredient list for a recipe and underline the items to indicate that they should be added to a shopping list. In such an example, the position information can be transmitted from the object tracking device to a computing end point such as a smart home device. The smart home device can utilize handwriting recognition to read the items from the list and generate a shopping list for the user. In some examples, the smartphone device can ask the user to confirm quantities or other information associated with the list. In some examples, the user can instruct the smart home device to place an order for the items on the list.

In another example, an object tracking system in accordance with example embodiments can be utilized in a teaching or other interactive environment. Users such as students may utilize an object tracking device such as a stylus to complete an assignment while in a classroom with other students and a teacher. Position information associated with each object tracking device from the students can be transmitted to a computing endpoint. The computing endpoint can perform handwriting recognition using the position information. The computing endpoint can analyze the text from the handwriting recognition to identify mistakes in the students' work. The teacher can be alerted to a mistake on a computing device associated with the teacher. This can enable teachers to focus on a particular student to see problems that arise, allowing the teacher to see what particular students are struggling and provide individualized attention in the moment.

In yet another example, a group of users may utilize flipcharts to prepare notes during a group meeting. Multiple teams within a group may generate separate flipcharts. As each team presents their findings to the group, a facilitator can capture their own notes on a whiteboard or other flipchart. A computing endpoint can capture all of these notes as they happen by utilizing handwriting recognition based on position information received from object tracking devices used by each of the individual users when preparing the flipcharts or writing on the whiteboard. Text can be generated for each of the user inputs so that the various members of the group can review each member's notes after the meeting. Indeed, because the position information can be associated with a time, the notes can be played back to relive each session in real-time.

Figure 11:
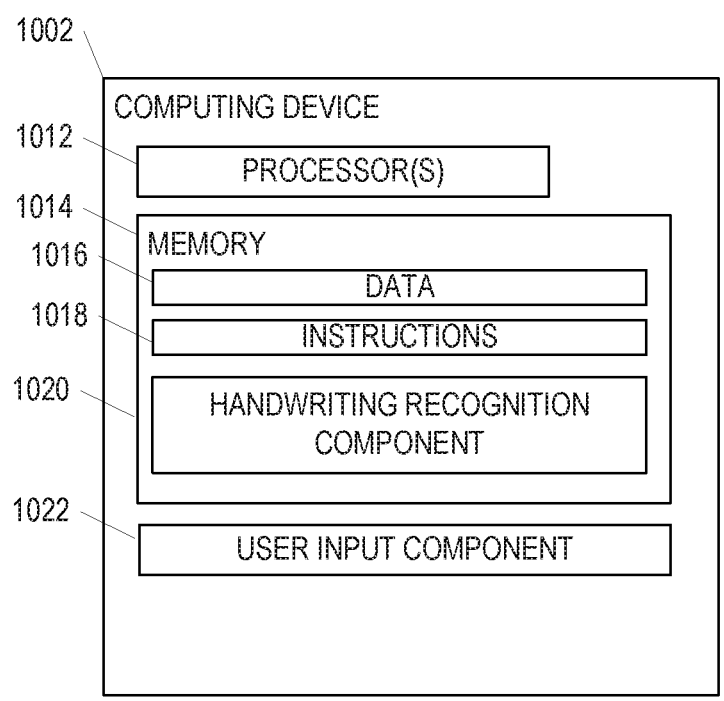
FIG. 11 depicts a block diagram of an example computing system that can be used to implement any type of computing device as described herein.

FIG. 11 depicts a block diagram of an example computing device that can be used to implement any of the computing devices in example embodiments of the present disclosure. For example, FIG. 11 can be used to implement a computing endpoint as described herein. The computing device 1002 can be a user computing device which can include, for example, a personal computing device (e.g., laptop or desktop), a mobile computing device (e.g., smartphone or tablet), a gaming console or controller, a wearable computing device, an embedded computing device, or any other type of computing device.

The computing device 1002 includes one or more processors 1012 and a memory 1014. The one or more processors 1012 can be any suitable processing device (e.g., a processor core, a microprocessor, an ASIC, a FPGA, a controller, a microcontroller, etc.) and can be one processor or a plurality of processors that are operatively connected. The memory 1014 can include one or more non-transitory computer-readable storage mediums, such as RAM, ROM, EEPROM, EPROM, flash memory devices, magnetic disks, etc., and combinations thereof. The memory 1014 can store data 1016 and instructions 1018 which are executed by the processor 1012 to cause the user computing device 1002 to perform operations.

In some implementations, the user computing device 1002 can store or include one or more handwriting recognition component(s) 1020. For example, the handwriting recognition component(s) 1020 can include a stroke-recognition algorithm, character-recognition algorithm, handwriting-recognition algorithm, and/or the like to analyze at least a portion of the position information received from an object tracking device. In some examples, the handwriting recognition component be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks.

In some implementations, the handwriting recognition component 1020 can be implemented at a user computing device which can receive position information directly from an object tracking device (e.g., over a Wi-Fi, bluetooth, or near-field communication connection). In other examples, the handwriting recognition component can be implemented at a remote server computing system which can receive position information over one or more networks such as the Internet. The handwriting recognition component 1020 can be stored in the user computing device memory 1014, and then used or otherwise implemented by the one or more processors 1012. In some implementations, the user computing device 1002 can implement multiple parallel instances of a single handwriting recognition component (e.g., to perform parallel recognitions processes across multiple instances of the handwriting recognition component).

The computing device 1002 can also include one or more user input component 1022 that receives user input. For example, the user input component 1022 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

In some implementations, the computing device 1002 includes or is otherwise implemented by a computing system including one or more computing devices. In instances in which the computing device 1002 is implemented as part of plural server computing devices, such computing devices can operate according to sequential computing architectures, parallel computing architectures, or some combination thereof.

As described above, the computing device 1002 can store or otherwise include one or more machine-learned models. For example, the models can be or can otherwise include various machine-learned models. Example machine-learned models include neural networks or other multi-layer non-linear models. Example neural networks include feed forward neural networks, deep neural networks, recurrent neural networks, and convolutional neural networks.

A computing device 1002 can train the models via interaction with a training computing system that is communicatively coupled over a network. The training computing system can be separate from the computing device 1002 or can be a portion of the computing device 1002. The training computing system can include a model trainer that trains the machine-learned models stored at the computing device 1002 using various training or learning techniques, such as, for example, backwards propagation of errors. In some implementations, performing backwards propagation of errors can include performing truncated backpropagation through time. The model trainer can perform a number of generalization techniques (e.g., weight decays, dropouts, etc.) to improve the generalization capability of the models being trained.

In particular, the model trainer can train the based on a set of training data. The training data can include, for example, position information associated with a user providing handwriting input and a corresponding character corresponding to the handwriting input.

In some implementations, if the user has provided consent, the training examples can be provided by a user computing device. Thus, in such implementations, the model provided to the user computing device can be trained by the training computing system on user-specific data received from the user computing device. In some instances, this process can be referred to as personalizing the model.

The model trainer includes computer logic utilized to provide desired functionality. The model trainer can be implemented in hardware, firmware, and/or software controlling a general purpose processor. For example, in some implementations, the model trainer includes program files stored on a storage device, loaded into a memory and executed by one or more processors. In other implementations, the model includes one or more sets of computer-executable instructions that are stored in a tangible computer-readable storage medium such as RAM hard disk or optical or magnetic media.

FIG. 11 illustrates one example computing system that can be used to implement the present disclosure. Other computing systems can be used as well.

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An object tracking system, comprising:
    a magnetic field transmitter disposed within a housing and comprising one or more transmitting coils configured to generate at least one stationary magnetic field;
    an object tracking device configured to be engaged by a user for movement in response to a handwriting input provided by the user, the object tracking device comprising:
        a magnetic field sensor in communication with the magnetic field transmitter and comprising one or more receiving coils configured to sense the at least one stationary magnetic field in response to movement of the object tracking device relative to a surface remote from the housing of the magnetic field transmitter;
        position tracking circuitry configured to determine at least one field strength associated with the at least one stationary magnetic field and to determine position information associated with the handwriting input provided by the user based on the at least one field strength; and
        backscatter circuitry including a frequency synthesizer configured to generate a baseband clock signal and a reference clock signal from at least one RF signal, a baseband processor configured to generate from the position information and the baseband clock signal one or more baseband packets, and a backscatter modulator configured to mix the one or more baseband packets with the reference clock signal to generate phase modulated data encoding the position information, the backscatter modulator configured to backscatter the at least one RF signal based on the phase modulated data; and a computing device configured to receive the position information from the backscatter circuitry and to initiate at least one action based on the handwriting input.

2. The object tracking system of claim 1, wherein:
the magnetic field transmitter operates at one or more frequencies less than 100 kHz; and
the communication interface operates at one or more frequencies greater than 1 MHz.

3. The object tracking system of claim 1, wherein:
the object tracking device does not include an on-board power source.

4. The object tracking system of claim 1, further comprising:
a radio-frequency (RF) transmitter remote from the object tracking device, the RF transmitter configured to generate RF signals.

5. The object tracking system of claim 4, wherein:
the RF transmitter is at least partially disposed within the housing; and
the computing device is at least partially disposed within the housing.

6. The object tracking system of claim 1, wherein:
the backscatter circuitry is configured to generate the at least one clock signal and the at least one output signal using power derived from the at least one RF signal.

7. The object tracking system of claim 1, wherein:
the magnetic field transmitter is configured to generate a plurality of magnetic fields in a sequence, each of the plurality of magnetic fields including a different frequency;
the object tracking device is a first object tracking device; and
the object tracking system further comprises a plurality of object tracking devices including the first object tracking device;
wherein each of the plurality of object tracking devices is associated with a different one of the plurality of magnetic fields.

8. The object tracking system of claim 1, wherein:
the surface is a first surface;
the object tracking device is a stylus configured to write on the first surface; and
the housing comprises one or more second surfaces remote from the first surface.

9. An object tracking device, comprising:
a magnetic field sensor comprising one or more receiving coils;
position tracking circuitry in communication with the magnetic field sensor, the position tracking circuitry configured to determine at least one field strength associated with at least one stationary magnetic field sensed at the one or more receiving coils in response to movement of the object tracking device relative to a surface remote from a source of the at least one stationary magnetic field, the position tracking circuitry configured to determine position information associated with a handwriting input to the object tracking device based at least in part on the at least one field strength; and
backscatter circuitry including a frequency synthesizer configured to generate a baseband clock signal and a reference clock signal from at least one RF signal, a baseband processor configured to generate from the position information and the baseband clock signal one or more baseband packets, and a backscatter modulator configured to mix the one or more baseband packets with the reference clock signal to generate phase modulated data encoding the position information, the backscatter modulator configured to backscatter the at least one RF signal based on the phase modulated data to transmit the position information to at least one remote computing device.

10. The object tracking device of claim 9, further comprising:
an inertial measurement unit in communication with the position tracking circuitry;
wherein the position tracking circuitry is configured to determine the position information based at least in part on an output of the inertial measurement unit.

11. The object tracking device of claim 9, wherein:
the magnetic field sensor includes three magnetic coils, each magnetic coil configured to sense a field strength associated with an individual one of three orthogonal magnetic fields; and
each of the three magnetic coils is arranged orthogonal to other ones of the magnetic coils.

12. The object tracking device of claim 9, wherein:
the backscatter circuitry is configured to generate power from one or more ambient radio-frequency signals;
wherein the magnetic field sensor is powered by an output of the backscatter circuitry.

13. An object tracking system, comprising:
a magnetic field transmitter comprising one or more transmitting coils configured to generate at least one stationary magnetic field;
a plurality of object tracking devices, each object tracking device comprising a magnetic field sensor configured to sense the at least one stationary magnetic field in response to movement of the object tracking device relative to a surface remote from the magnetic field transmitter, each object tracking device comprising backscatter circuitry including a frequency synthesizer configured to generate a baseband clock signal and a reference clock signal from at least one RF signal, a baseband processor configured to generate from position information and the baseband clock signal one or more baseband packets, and a backscatter modulator configured to mix the one or more baseband packets with the reference clock signal to generate phase modulated data encoding the position information, the backscatter modulator configured to backscatter the at least one RF signal based on the phase modulated data to transmit the position information based on a sensed strength of the at least one stationary magnetic field; and
one or more computing devices configured to receive the position information from the communication interface and to initiate at least one action based on the position information.

14. The object tracking system of claim 13, wherein:
each of the plurality of object tracking devices is configured to transmit corresponding position information to a different one of the one or more computing devices.

15. The object tracking system of claim 13, wherein:
each of the plurality of object tracking devices is configured to transmit corresponding position information to a first computing device of the one or more computing devices.

16. The object tracking system of claim 13, further comprising:
a radio-frequency (RF) transmitter remote from the plurality of object tracking devices, the RF transmitter configured to generate an RF signal.

* * * * *